United States Patent [19]

Nemoto et al.

[11] Patent Number: 5,160,783
[45] Date of Patent: Nov. 3, 1992

[54] EPOXY RESIN-IMPREGNATED GLASS CLOTH SHEET HAVING ADHESIVE LAYER

[75] Inventors: Yousui Nemoto; Akiyoshi Itoh, both of Mie; Toshimi Kohmura; Yasuhiro Horiba, both of Gifu, all of Japan

[73] Assignee: Mitsubishi Petrochemical Co., Ltd., Tokyo, Japan

[21] Appl. No.: 630,240

[22] Filed: Dec. 19, 1990

[30] Foreign Application Priority Data

Dec. 19, 1989 [JP] Japan .................... 1-327106

[51] Int. Cl.$^5$ ................................................. C09J 7/04
[52] U.S. Cl. ......................................... 428/261; 428/334; 428/355; 428/413; 428/416; 428/418
[58] Field of Search ............ 428/343, 261, 355, 413, 428/334, 273, 416, 418

[56] References Cited

U.S. PATENT DOCUMENTS

| | | | |
|---|---|---|---|
| 2,799,596 | 7/1957 | Frantz | 428/261 |
| 2,951,490 | 12/1959 | Hopper | 428/261 |
| 3,068,117 | 12/1962 | Korpman | 428/261 |
| 3,100,160 | 8/1963 | Korpman | 428/261 |
| 3,280,216 | 10/1966 | Partansky | 428/273 |
| 3,472,730 | 10/1969 | Frigstad | 428/334 |
| 3,523,037 | 8/1970 | Chellis | 428/273 |
| 3,894,113 | 7/1975 | Pagel | 428/261 |
| 4,101,693 | 7/1978 | Tsen | 428/273 |
| 4,374,890 | 2/1983 | Shimizu | 428/355 |
| 4,803,105 | 2/1989 | Kretow | 428/261 |
| 4,839,229 | 6/1989 | Jellinek | 428/261 |
| 4,900,601 | 2/1990 | Hälg | 428/413 |
| 4,908,273 | 3/1990 | Urech | 428/355 |

*Primary Examiner*—Jenna L. Davis
*Attorney, Agent, or Firm*—Oblon, Spivak, McClelland, Maier & Neustadt

[57] ABSTRACT

An epoxy resin-impregnated glass cloth sheet having an adhesive layer provided on at least one side of the surface thereof, characterized in that (A) said epoxy resin-impregnated glass cloth sheet is formed by impregnating glass cloth with a curable epoxy resin composition and curing it, said curable epoxy resin composition comprising an epoxy resin represented by the following structural formula (I), a brominated epoxy resin and a curing agent for epoxy resin in such an amount that the content of the epoxy resin represented by the following structural formula (I) is 5 to 50% by weight based on the amount of the entire epoxy resins and the content of bromine atom is 14 to 30% by weight based on the combined amount of the entire epoxy resins and the curing agent for epoxy resin; and (B) said adhesive layer is composed of a curable epoxy resin composition comprising an epoxy resin represented by the following structural formula (I), a brominated epoxy resin, an acrylonitrile/butadiene copolymer having carboxyl groups in its molecule which is a solid at room temperature, and a curing agent for epoxy resin in such an amount that the content of the epoxy resin represented by the following structural formula (I) is 5 to 70% by weight based on the amount of the entire epoxy resins, the content of the acrylonitrile/butadiene copolymer is 20 to 70 parts by weight based on 100 parts by weight of the entire epoxy resins and the content of bromine atom is 10 to 30% by weight based on the combined amount of the entire epoxy resins, the acrylonitrile/butadiene copolymer and the curing agent for epoxy resin and the copper clad sheet are disclosed.

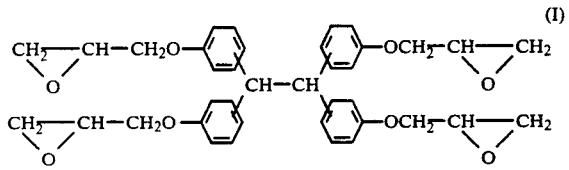

12 Claims, 1 Drawing Sheet

EPOXY RESIN-IMPREGNATED GLASS CLOTH SHEET HAVING ADHESIVE LAYER

FIELD OF THE INVENTION

This invention relates to an epoxy resin-impregnated glass cloth sheet having an adhesive layer, and more particularly to a heat-resistant, flame-retardant epoxy resin-impregnated glass cloth sheet having an adhesive layer which has no fluidity, is excellent in such characteristics as adhesion, soldering heat resistance, flexibility, etc. and is highly flame-retardant.

BACKGROUND OF THE INVENTION

FIG. 1 and FIG. 2 show the cross-sectional views of embodiments of substrates for LSI (large scale integrated circuit), which are directly loaded with LSI chips. Such substrate for carrying LSI chips can be prepared in the following manner. An electrical conductor 3 is laminate-bonded onto the adhesive layer 2 of an epoxy resin-impregnated glass cloth sheet 1 by means of heated rollers, etc., and a copper foil of the electrical conductor 3 is then chemically etched to form a predetermined circuit. If desired, through-holes having electrical conductivity may be optionally formed. Subsequently, LSI chips 4 are placed and bonded by means of an adhesive 5 for die bond, and LSI chips 4 are then connected to the circuit by means of bonding wires 6 to form a module.

As adhesives conventionally used for such substrates for carrying LSI chips, there are known epoxy-novolak resins, nitrile-phenol resins, nylon-epoxy resins, polyester resins, acrylic resins. As circuit designs have been highly complicated in recent years, it has been demanded to provide high-performance adhesives having more higher reliability, particularly adhesives which have scarcely fluidity during the course of copper cladding and exhibit high adhesion between the substrate and copper foil under high-temperature conditions.

Further, adhesives having flame retardance in addition to the above-described characteristics have been required from the viewpoint of safety of electrical apparatuses. To obtain flame-retarded adhesives, flame-retardant fillers or flame-retardant resin components singly or in combination have been conventionally used. However, there is a problem that when the flame-retardant fillers are blended, a lowering in the adhesion of metallic foil is caused. Further, there are problems that when the flame-retardant resin components are used, heat-resistance is generally lowered and a lowering in adhesion between the substrate and the metallic foil under high-temperature conditions is caused.

Epoxy resin-impregnated glass cloth sheets are already known as substrates for carrying LSI chips. However, it is demanded to provide epoxy resin-impregnated glass cloth sheets which have more higher reliability and are excellent in heat resistance and flame retardance.

The present inventors have eagerly made studies to solve the above-mentioned problems associated with the prior art and found that the above-mentioned problems can be solved by providing an adhesive layer comprising a specific curable epoxy resin composition on an epoxy resin-impregnated glass cloth sheet formed by impregnating glass cloth with a specific curable epoxy resin composition and curing it.

SUMMARY OF THE INVENTION

An object of the present invention is to provide an epoxy resin-impregnated glass cloth sheet having an adhesive layer, which has an excellent performance as a substrate for carrying LSI chips.

Another object of the present invention is to provide an epoxy resin-impregnated glass cloth sheet having an adhesive layer, said adhesive layer being provided on a substrate which is excellent in heat resistance and flame retardance and the adhesive of said adhesive layer being scarcely fluidized during bonding and being excellent in adhesion to a metallic foil under high-temperature conditions and highly flame retardant.

Other objects and effects of the present invention will be apparent from the following description.

The present invention provided an epoxy resin-impregnated glass cloth sheet having an adhesive layer provided on at least one side of the surface thereof, characterized in that (A) said epoxy resin-impregnated glass cloth sheet is formed by impregnating glass cloth with a curable epoxy resin composition and curing it, said curable epoxy resin composition comprising an epoxy resin represented by the following structural formula (I), a brominated epoxy resin and a curing agent for epoxy resin in such an amount that the content of the epoxy resin represented by the following structural formula (I) is 5 to 50% by weight based on the amount of the entire epoxy resins and the content of bromine atom is 14 to 30% by weight based on the combined amount of the entire epoxy resins and the curing agent for the epoxy resin; and (B) said adhesive layer is composed of a curable epoxy resin composition comprising an epoxy resin represented by the following structural formula (I), a brominated epoxy resin, an acrylonitrile/butadiene copolymer having carboxyl groups in its molecule which is a solid at room temperature and a curing agent for epoxy resin in such an amount that the content of the epoxy resin represented by the following structural formula (I) is 5 to 70% by weight based on the amount of the entire epoxy resins, the content of said acrylonitrile/butadiene copolymer is 20 to 70 parts by weight based on 100 parts by weight of the entire epoxy resins and the content of bromine atom is 10 to 30% by weight based on the combined amount of the entire epoxy resins, the acrylonitrile/butadiene copolymer and the curing agent for the epoxy resin.

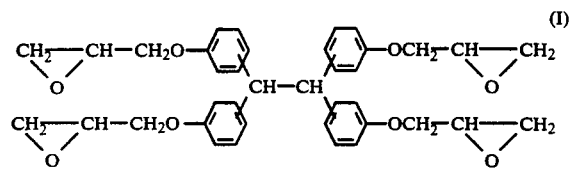

DETAILED DESCRIPTION OF THE INVENTION

Figure 1:
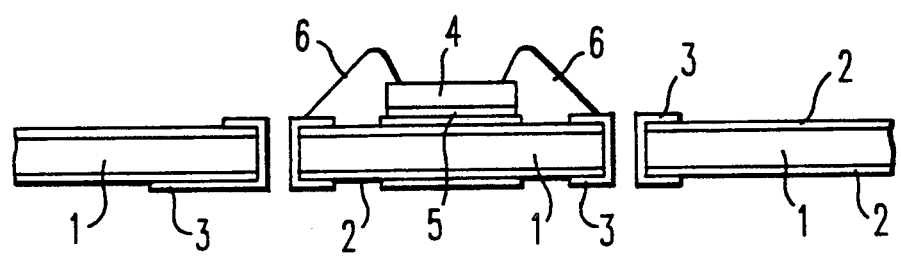
FIGS. 1 and 2 show each the cross-sectional view of an embodiment of a substrate for carrying LSI chips. In Figs., numeral 1 represents an epoxy resin-impregnated glass cloth sheet, 2 represents an adhesive layer, 3 represents an electrical conductor, 4 represents LSI chip, 5 represents an adhesive for die bond, and 6 represents bonding wire.
Figure 2:
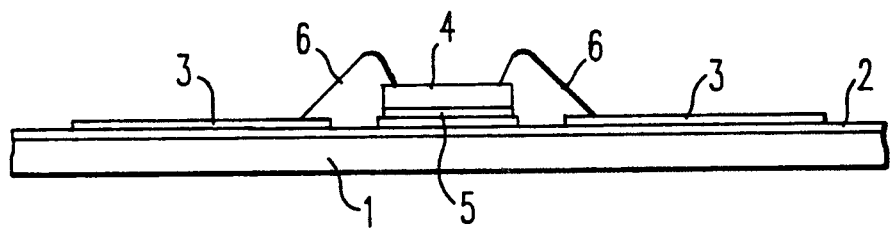

In the present invention, the curable epoxy resin composition for use in impregnating glass cloth and the curable epoxy resin composition for the adhesive layer to be provided on the epoxy resin-impregnated glass cloth sheet contain the epoxy resin represented by the structural formula (I). The epoxy resin (I) is commercially available, for example, under trade name of Epikote 1031S or Epikote 1031 (products of Yuka Shell Epoxy KK). Accordingly, the present invention can be carried out by using such commercially available products.

In the above-described two kinds of the curable epoxy resin compositions according to the present invention, the amount of the epoxy resin (I) to be blended should be 5 to 50% by weight based on the amount of the entire epoxy resins when the epoxy resin (I) is used for the curable epoxy resin composition for used in impregnating glass cloth, and the amount of the epoxy resin (I) to be blended should be 5 to 70% by weight based on the amount of the entire epoxy resins when the epoxy resin (I) is used for the curable epoxy resin composition for the adhesive layer. When the amount of the epoxy resin (I) in the epoxy resin composition for impregnating glass cloth is less than 5% by weight, the heat resistance of the sheet per se of the produced epoxy resin-impregnated glass cloth sheet is deteriorated. When the amount of the epoxy resin (I) in the epoxy resin composition for the adhesive layer is less than 5% by weight, the heat resistance of the adhesive layer itself is deteriorated, while when the amount is more than 70% by weight, flame retardance is poor.

In the present invention, the epoxy resin composition for use in impregnating glass cloth as well as the epoxy resin composition for the adhesive layer contain the brominated epoxy resin as an essential component. Examples of the brominated epoxy resin which can be used in the present invention include brominated bisphenol A type epoxy resins and brominated novolak type epoxy resins. These brominated epoxy resins may be used either alone or in combination of two or more of them.

The amount of the brominated epoxy resin to be blended in the present invention is 14 to 30% by weight, in terms of the content of bromine atom, based on the combined amount of the entire epoxy resins and the curing agent for the epoxy resin when the brominated epoxy resin is used for the epoxy resin composition for impregnating glass cloth. The amount of the brominated epoxy resin to be blended is 10 to 30% by weight, in terms of the content of bromine atom, based on the combined amount of the entire epoxy resins, the acrylonitrile/butadiene copolymer and the curing agent for the epoxy resin when the brominated epoxy resin is used for the epoxy resin composition for the adhesive layer. When the brominated epoxy resin is blended in such an amount that the content of bromine atom becomes less than the lower limits described above, the sheet itself of the produced epoxy resin-impregnated glass cloth sheet and the adhesive layer have poor flame retardance. When the content of bromine atom exceeds 30% by weight, the heat resistance of the adhesive layer itself is deteriorated when the brominated epoxy resin is used for the epoxy resin composition for the adhesive layer.

In addition to the epoxy resin (I) and the brominated epoxy resin, the epoxy resin composition for impregnating glass cloth and the epoxy resin composition for the adhesive layer, according to the present invention, may optionally contain other epoxy resins in an amount which has an adverse effect on the contents of said epoxy resin (I) and bromine atom as described above. Examples of such epoxy resins which may be used in combination with the epoxy resin (I) and the brominated epoxy resin include bisphenol A type epoxy resins, bisphenol F type epoxy resins, novolak type epoxy resins, alicyclic epoxy resins, glycidyl ester type epoxy resins, glycidylamine type epoxy resins, heterocyclic epoxy resins and urethane-modified epoxy resins. These epoxy resins may be used either alone or in combination of two or more of them.

In the present invention, the epoxy resin composition for impregnating glass cloth and the epoxy resin composition for the adhesive layer contain a curing agent for epoxy resin. Examples of the curing agent for epoxy resin include amine curing agents, polyaminoamide curing agents, acids and acid anhydrides, dicyandiamide, basic active hydrogen compounds such as organic acid hydrazides, imidazoles, amineimides, Lewis acids, Bronsted acid salts and phenolic resins. These compounds may be used either alone or in a combination of two or more of them.

The epoxy resin composition for the adhesive layer according to the present invention contain an acrylonitrile/butadiene copolymer having carboxyl group in its molecule which is a solid at room temperature (20° C.). Examples of the copolymer include copolymers obtained by carboxylating the terminal of an acrylonitrile/butadiene copolymer and terpolymers obtained by copolymerizing acrylonitrile with butadiene and a monomer having carboxyl group such as acrylic acid. The copolymers have an acrylonitrile content of 10 to 50% by weight, preferably 15 to 35% by weight, a carboxyl group content of 2.0 to 3.5% by weight, a specific gravity (25/25° C.) of 0.94 to 1.02, a molecular weight from 8,000 to 80,000 and a Mooney viscosity $ML_{1+4}$ (100° C.) of from 10 to 100, preferably from 40 to 80 and are preferably a solid having no fluidity at room temperature. A typical example of such copolymer which is commercially available is Nipol 1072 (a produce of Nippon Zeon Co., Ltd.) and T-4633 (a produce of Japan Synthetic Rubber Co., Ltd.).

The content of the acrylonitrile/butadiene copolymer in the epoxy resin composition for the adhesive layer according to the present invention is 20 to 70 parts by weight, preferably 30 to 65 parts by weight based on 100 parts by weight of the amount of the entire epoxy resins. When the amount of the copolymer is too small, the adhesive is greatly fluidized and there are caused troubles that the adhesive flows out from the adhesive layer into device hole part when a metallic foil is bonded to substrates having various shapes, such as a substrate having device hole. Further, adhesion to the metallic foil is lowered. On the other hand, when the amount of the copolymer is too large, adhesion at elevated temperatures is lowered.

In the present invention, the epoxy resin composition for impregnating glass cloth and the epoxy resin composition for the adhesive layer may contain various additives according to the use of the epoxy resin-impregnated glass cloth sheet. Examples of such additives include inorganic powders such as calcium carbonate, titanium oxide, zinc oxide, silica, alumina, hydrated alumina and bentonite; coupling agents such as silicone coupling agent and titanate coupling agent; flame retarder; coloring material, etc.

The epoxy resin-impregnated glass cloth sheet having an adhesive layer according to the present invention can be prepared by various methods. A typical embodiment thereof is illustrated below.

First, the curable epoxy resin composition for impregnating glass cloth is dissolved in an appropriate solvent such as acetone, methyl ethyl ketone, toluene, methyl cellosolve or dimethylformamide or a mixed solvent of two or more of them, and the components of the composition are thoroughly mixed to prepare varnish. Glass cloth is then impregnated with the resulting varnish and dried to remove the solvent. The impregnated glass cloth is heated under pressure to cure the resin composition. Alternatively, the resin composition is cured while drying the solvent to obtain an epoxy resin-impregnated glass cloth sheet having flame retardance. The drying of the solvent is carried out at a temperature of room temperature to 130° C. for 1 to 60 minutes. Curing is carried out at a temperature of 80° to 200° C. for 10 minutes to one day. Pressure is 1 to 100 kgf/cm$^2$ when curing is carried out under pressure.

Subsequently, the epoxy resin composition for the adhesive layer is dissolved in the solvent described above, and the components of the composition are thoroughly mixed to prepare varnish. The resulting varnish is coated on the epoxy resin-impregnated glass cloth sheet prepared in the manner mentioned above, and the solvent is removed by drying to thereby obtain an epoxy resin-impregnated glass cloth sheet having an adhesive layer according to the present invention. The drying of the solvent is carried out at a temperature of room temperature to 170° C. for 1 to 60 minutes.

The adhesive layer of the epoxy resin impregnated glass cloth sheet of the present invention is scarcely fluidized and is excellent in adhesion, soldering heat resistance, flexibility and flame retardance, and the sheet per se is excellent in heat resistance and flame retardance.

The epoxy resin-impregnated glass cloth sheet of the present invention is now illustrated in greater detail by reference to the following preparative examples, examples and comparative examples which, however, are not to be construed as limiting the present invention in any way. Parts given below are by weight otherwise stated.

PREPARATIVE EXAMPLES A TO C

Preparation of epoxy resin-impregnated class cloth sheets A to C

Varnish of each epoxy resin composition indicated in Table 1 was prepared. Glass cloth of 0.2 mm in thickness was impregnated with each of the resulting varnish. The impregnated glass cloth was dried in an oven at 120° C. for 20 minutes and then cured in an oven at 170° C. for 30 minutes. The flame retardance of each of the resulting epoxy resin-impregnated glass cloth sheets is shown in Table 1.

TABLE 1

| | Epoxy resin-impregnated glass cloth sheet | | |
|---|---|---|---|
| | A | B | C |
| Composition of epoxy resin varnish (parts) | | | |
| Epikote 1031S *1 | 10 | 30 | 30 |
| Epikote 5050 *2 | 30 | 30 | — |
| Bren *3 | 30 | 10 | 30 |
| Epikote *4 | 30 | 30 | 40 |
| Dicyandiamide | 5 | 5 | 5 |
| 1B2MZ *5 | 0.5 | 0.5 | 0.5 |
| Methyl ethyl ketone | 60 | 60 | 60 |
| Methyl cellosolve | 20 | 20 | 20 |
| Bromine atom content (wt. %) *6 | 24.5 | 17.6 | 10.2 |
| Flame resistance test *7 result of produced epoxy resin-impregnated glass cloth sheet | 94 V-0 | 94 V-0 | 94–1 or below |

Notes (in Table 1)
*1: Trade name (a product of Yuka Shell Epoxy KK), epoxy equivalent: 195, epoxy resin represented by the formula (I).
*2: Trade name (a product of Yuka Shell Epoxy KK), bromine content: 50 wt. %, epoxy equivalent: 440.
*3: Trade name (a product of Nippon Kayaku Co., Ltd.), bromine content: 36 wt. %, epoxy equivalent: 285.
*4: Trade name (a product of Yuka Shell Epoxy KK), epoxy equivalent: 460, general purpose epoxy resin.
*5: Trade name (a product of Shikoku Kasei Kogyo KK), imidazole type curing agent.
*6: Content (wt. %) based on the combined amount of the entire epoxy resins and the curing agent for epoxy resin.
*7: Flame resistance test was carried out according to UL-94 vertical method (Underwriters' Laboratories Inc. Standard Test).

EXAMPLES 1 TO 6 AND COMPARATIVE EXAMPLES 1 TO 5

Varnish of each epoxy resin composition for the adhesive layer was prepared by using each blend indicated in Table 2.

Each of the resulting varnish was coated on the epoxy resin-impregnated glass cloth sheet A prepared in the aforesaid Preparative Example A in such an amount as to give a dry thickness of 20 μm. The coated sheet was dried in an oven at 140° C. for 5 minutes. A copper foil of 35 μm in thickness was then laminated onto the adhesive-coated surface of the sheet by using rollers under such conditions that a roller temperature was 160° C., velocity was 1 m/min and pressure was 1 kg/cm. The laminate was heated in an oven at 170° C. for one hour to cure the epoxy resin composition, thus preparing each copper-clad substrate.

The characteristics of each of the resulting copper-clad substrates are shown in Table 2.

TABLE 2

| | Examples | | | | | | Comparative Examples | | | | |
|---|---|---|---|---|---|---|---|---|---|---|---|
| | 1 | 2 | 3 | 4 | 5 | 6 | 1 | 2 | 3 | 4 | 5 |
| Composition of epoxy resin varnish (parts) for adhesive layer | | | | | | | | | | | |
| Epikote 1031S *1 | 60 | 40 | 40 | 30 | 20 | 10 | 40 | 40 | 40 | 40 | — |
| Bren *2 | — | 60 | — | 50 | — | 40 | 60 | 60 | 60 | 40 | 10 |
| Epikote 5050 *3 | 40 | — | 40 | 20 | 50 | 50 | — | — | — | — | 50 |
| Epikote 5046 *4 | — | — | 10 | — | — | — | — | — | — | — | — |
| Epikote 1001 *5 | — | — | 10 | — | 30 | — | — | — | — | 20 | 40 |
| Nipol 1072 *6 | 20 | 20 | 40 | 70 | 40 | 40 | — | 10 | 80 | 40 | 40 |
| Hycar CTBN *7 | — | — | — | — | — | — | 20 | — | — | — | — |
| Dicyandiamide | 4 | 4 | — | — | — | — | 4 | 4 | 4 | — | — |
| 1B2MZ *8 | 0.5 | 0.5 | — | — | — | — | 0.5 | 0.5 | 0.5 | — | — |
| 2PHZCN *8 | — | — | 8 | — | — | — | — | — | — | — | — |

TABLE 2-continued

|  | Examples | | | | | | Comparative Examples | | | | |
| --- | --- | --- | --- | --- | --- | --- | --- | --- | --- | --- | --- |
|  | 1 | 2 | 3 | 4 | 5 | 6 | 1 | 2 | 3 | 4 | 5 |
| Diaminodiphenylsulfone | — | — | — | 24 | 17 | 19 | — | — | — | 24 | 14 |
| BF$_3$-400 *9 | — | — | — | 0.3 | 0.3 | 0.3 | — | — | — | 0.3 | 0.3 |
| Methyl ethyl ketone | 50 | 60 | 90 | 190 | 100 | 100 | 44 | 40 | 260 | 110 | 100 |
| Dimethylformamide | 30 | 40 | 50 | 130 | 60 | 60 | 20 | 20 | 170 | 70 | 60 |
| Bromine atom content (wt. %) *10 | 16.1 | 17.3 | 15.0 | 14.4 | 15.9 | 24.7 | 17.3 | 18.9 | 11.7 | 8.7 | 18.5 |
| Characteristics of copper-clad substrate | | | | | | | | | | | |
| Fluidity during roll pressing (mm) *11 | <0.1 | <0.1 | <0.1 | <0.1 | <0.1 | <0.1 | 0.3 | 0.5 | 0.2 | <0.1 | <0.1 |
| Normal peeling strength of copper foil (kgf/cm) *12 | | | | | | | | | | | |
| 25° C. | 1.8 | 1.8 | 2.0 | 2.1 | 2.3 | 2.2 | 1.0 | 1.1 | 1.5 | 1.8 | 1.7 |
| 150° C. | 1.4 | 1.2 | 1.3 | 1.3 | 1.5 | 1.4 | 0.5 | 0.6 | 0.4 | 1.2 | 0.7 |
| Flame resistance test *13 result | 94 V-0 | 94 V-0 | 94 V-0 | 94 V-0 | 94 V-0 | 94 V-0 | 94 V-0 | 94 V-0 | 94 V-1 or below | 94 V-1 or below | 94 V-0 |

Notes (in Table 2):
*1: Trade name (a product of Yuka Shell Epoxy KK), epoxy equivalent: 195, epoxy resin represented by the formula (I).
*2: Trade name (a product of Nippon Kayaku Co., Ltd.), brominated novolak type epoxy resin, bromine content: 36 wt. %, epoxy equivalent: 285.
*3: Trade name (a product of Yuka Shell Epoxy KK), brominated bisphenol A type epoxy resin, bromine content: 50 wt. %, epoxy equivalent: 440.
*4: Trade name (a product of Yuka Shell Epoxy KK), bromine content: 22 wt. %, epoxy equivalent: 480.
*5: Trade name (a product of Yuka Shell Epoxy KK), epoxy equivalent: 470.
*6: Trade name (a product of Nippon Zeon Co., Ltd.), acrylonitrile/butadiene copolymer having carboxyl group which is a solid at room temperature, carboxyl group content: 3.35 wt. %.
*7: Trade name (a product of Goodrich Co.), acrylonitrile/butadiene copolymer having carboxyl group which is liquid at room temperature, carboxyl group content: 2.40 wt. %.
*8: Trade name (a product of Shikoku Kasei Kogyo KK), imidazole type curing agent.
*9: BF$_3$ monoethylamine complex.
*10: Bromine content (wt. %) based on the combined amount of the entire epoxy resins, the acrylonitrile/butadiene copolymer and the curing agent for epoxy resin.
*11: Test method was as follows: A hole of 10 mm square was punched out of the epoxy resin-impregnated glass cloth sheet having an adhesive layer. A metal foil was put on the upper surface of the adhesive layer of the holed substrate. Laminating was carried out at 160° C. under a roll pressure of 1 kg/cm, and the laminate was heated at 170° C. for one hour to effect curing thus obtaining a metal foil-clad substrate. The flowed-out width l (mm) of the adhesive which flowed out from the adhesive layer into the hole part of the metal foil-clad substrate was measured. The measurement was made for the 4 sides of the hole. The mean value was referred to as fluidity.
*12: Measurement was made according to JISC-6481.
*13: Flame resistance test was carried out according to UL-94 vertical method (Underwriters' Laboratories Inc. Standard Test).

It is apparent from Table 2 that the epoxy resin-impregnated glass cloth sheets having an adhesive layer of Examples are superior to those of Comparative Examples in the fluidity of the adhesive layer during roll press bonding, the peeling strength of copper foil, particularly peeling strength during heating and flame retardance on the whole.

EXAMPLE 7 AND COMPARATIVE EXAMPLE 6

Varnish of the epoxy resin composition prepared in Example 2 was coated on the epoxy resin impregnated glass cloth sheet B or C in such an amount as to give a dry thickness of 20 μm. A copper-clad substrate was then prepared in the same way as in Example 2.

The characteristics of each of the resulting copper-clad substrates were measured in the same way as in Example 2.

The results are shown in Table 3.

TABLE 3

|  | Ex. 7 | Comp. Ex. 6 |
| --- | --- | --- |
| Epoxy resin-impregnated glass cloth sheet used | B | C |
| Characterstics of copper-clad substrate | | |
| Fluidity during roll pressing (mm) | <0.1 | <0.1 |
| Normal peeling strength of copper foil (kgf/cm) | | |
| 25° C. | 1.8 | 1.8 |
| 150° C. | 1.2 | 1.2 |
| Flame resistance test result | 94 V-0 | 94 V-1 or below |

It is apparent from Table 3 that the sheet of Example 7 is scarcely fluidized during roll press bonding, has a high copper foil peeling strength particularly at elevated temperatures and is superior in flame retardance, while the sheet of Comparative Example 6 is inferior in flame retardance.

While the present invention has been described in detail and with reference to specific embodiments thereof, it is apparent to one skilled in the art that various changes and modification can be made therein without departing from the spirit and the scope of the present invention.

What is claimed is:

1. An epoxy resin-impregnated glass cloth sheet having an adhesive layer provided on at least one side of the surface thereof, comprising (A) said epoxy resin-impregnated glass cloth sheet is formed by impregnating glass cloth with a curable epoxy resin composition and curing it to its final curing stage, said curable epoxy resin composition comprising an epoxy resin represented by the following structural formula (I),

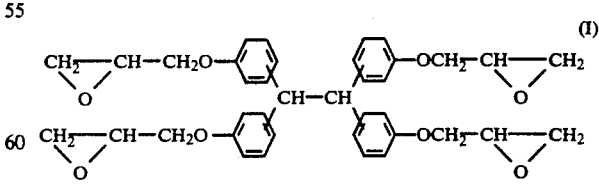

a brominated epoxy resin and a curing agent for epoxy resin in such an amount that the content of the epoxy resin represented by the above structural formula (I) is 5 to 50% by weight based on the amount of the entire epoxy reins and the content of bromine atom is 14 to 30% by weight based on the combined amount of the entire epoxy resins and the curing agent for epoxy resin; and (B) said adhesive layer is composed of a curable epoxy resin composition comprising an epoxy resin ing it to its final curing stage, said curable epoxy resin composition comprising an epoxy resin represented by the following structural formula (I)

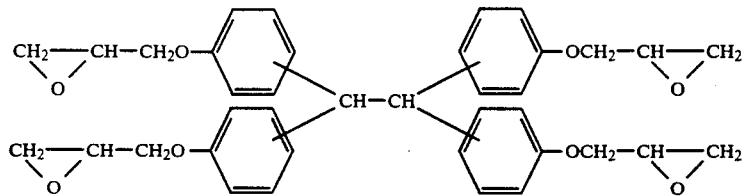

represented by the above structural formula (I), a brominated epoxy resin, an acrylonitrile/butadiene copolymer having carboxyl groups in its molecule which is a solid at room temperature, and a curing agent for epoxy resin in such an amount that the content of the epoxy resin represented by the above structural formula (I) is 5 to 70% by weight based on the amount of the entire epoxy resins, the content of the acrylonitrile/butadiene copolymer is 20 to 70 parts by weight based on 100 parts by weight of the entire epoxy resins and the content of bromine atom is 10 to 30% by weight based on the combined amount of the entire epoxy resins, the acrylonitrile/butadiene copolymer and the curing agent for epoxy resin.

2. An epoxy resin-impregnated glass cloth sheet having an adhesive layer as claimed in claim 1, wherein said brominated epoxy resin is selected from the group consisting of brominated bisphenol A type epoxy resins and brominated novolak type epoxy resins.

3. An epoxy resin-impregnated glass cloth sheet having an adhesive layer as claimed in claim 1, wherein said curing agent for epoxy resin is selected from the group consisting of amine curing agents, polyaminoamide curing agents, acids, acid anhydrides, dicyandiamide, basic active hydrogen compounds, imidazoles, amineimides, Lewis acids, Bronsted acid salts and phenolic resins.

4. An epoxy resin-impregnated glass cloth sheet having an adhesive layer as claimed in claim 1, wherein said acrylonitrile/butadiene copolymer having carboxyl groups in its molecule is selected from the group consisting of copolymers obtained by carboxylating the terminal of an acrylonitrile/butadiene copolymer and terpolymers obtained by copolymerizing acrylonitrile with butadiene and a monomer having carboxyl group.

5. An epoxy resin-impregnated glass cloth sheet having an adhesive layer as claimed in claim 4, wherein said acrylonitrile/butadiene copolymer having carboxyl groups in its molecule have an acrylonitrile content of 10 to 50% by weight, a carboxyl group content of 2.0 to 3.5% by weight, a specific gravity (25/25° C.) of 0.94 to 1.02, a molecular weight of from 8,000 to 80,000 and a Mooney viscosity $ML_{14}$ (100° C.) of from 10 to 100.

6. An epoxy resin-impregnated glass cloth sheet having an adhesive layer as claimed in claim 1, wherein said content of the acrylonitrile/butadiene copolymer is 30 to 65 parts by weight based on 100 parts by weight of the entire epoxy resins.

7. A copper-clad epoxy resin-impregnated glass cloth sheet characterized by having an adhesive layer with a copper layer provided thereon provided on at least one side of the surface of epoxy resin-impregnated glass cloth sheet, comprising (A) said epoxy resin-impregnated glass cloth sheet is formed by impregnating glass cloth with a curable epoxy resin composition and cura brominated epoxy resin and a curing agent for epoxy resin in such an amount that the content of the epoxy resin represented by the above structural formula (I) is 5 to 50% by weight based on the amount of the entire epoxy resins and the content of bromine atom is 14 to 15% by weight based on the combined amount of the entire epoxy resins and the curing agent for epoxy resin; and (B) said adhesive layer is interposed between the copper layer and the cured epoxy resin-impregnated glass cloth sheet is composed of a curable epoxy resin composition comprising an epoxy resin represented by the above structural formula (I), a brominated epoxy resin, an acrylonitrile/butadiene copolymer having carboxyl groups in its molecule which is a solid at room temperature, and a curing agent for epoxy resin in such an amount that the content of the epoxy resin represented by the following structural formula (I) is 5 to 70% by weight based on the amount of the entire epoxy reins, the content of the acrylonitrile/butadiene copolymer is 20 to 70 parts by weight based on 100 parts by weight of the entire epoxy resins and the content of bromine atom is 10 to 30% by weight based on the combined amount of the entire epoxy resins, the acrylonitrile/butadiene copolymer and the curing agent for epoxy resin.

8. A copper clad epoxy resin-impregnated glass cloth sheet having an adhesive layer as claimed in claim 7, wherein said brominated epoxy resin is selected from the group consisting of brominated bisphenol A type epoxy resins and brominated novolak type epoxy resins.

9. A copper clad epoxy resin-impregnated glass cloth sheet having an adhesive layer as claimed in claim 7, wherein said curing agent for epoxy resin is selected from the group consisting of amine curing agents, polyaminoamide curing agents, acids, acid anhydrides, dicyandiamide, basic active hydrogen compounds, imidazoles, amineimides, Lewis acids, Bronsted acid salts and phenolic resins.

10. A copper-clad epoxy resin-impregnated glass cloth sheet having an adhesive layer as claimed in claim 7, wherein said acrylonitrile/butadiene copolymer having carboxylic groups in its molecule is selected from the group consisting of copolymers obtained by carboxylating the terminal of an acrylonitrile/butadiene copolymer and terpolymers obtained by copolymerizing acrylonitrile with butadiene and a monomer having carboxyl group.

11. A copper-clad epoxy resin-impregnated glass cloth sheet having an adhesive layer as claimed in claim 7, wherein said acrylonitrile/butadiene copolymer having carboxylic groups in its molecule have an acrylonitrile content of 10 to 50% by weight, a carboxyl group content of 2.0 to 3.5% by weight, a specific gravity (25/25° C.) of 0.94 to 1.02, a molecular weight of from 8,000 to 80,000 and a Mooney viscosity $ML_{1+4}$ (100° C.) of from 10 to 100.

12. A copper clad epoxy resin-impregnated glass cloth sheet having an adhesive layer as claimed in claim 7, wherein said content of the acrylonitrile/butadiene copolymer is to 30 to 65 parts by weight based on 100 parts by weight of the entire epoxy resins.

* * * * *